United States Patent [19]
Blackmer et al.
[11] 4,097,767
[45] Jun. 27, 1978

[54] OPERATIONAL RECTIFIER

[75] Inventors: David E. Blackmer, Wilton; C. Rene Jaeger, South Lyndeboro, both of N.H.
[73] Assignee: DBX, Incorporated, Newton, Mass.

[21] Appl. No.: 759,734
[22] Filed: Jan. 17, 1977
[51] Int. Cl.[2] .......... H03K 17/00
[52] U.S. Cl. .......... 307/229; 307/261; 328/26
[58] Field of Search .......... 307/229, 230, 260, 261; 363/127; 328/26

[56] References Cited

U.S. PATENT DOCUMENTS

| | | | |
|---|---|---|---|
| 3,358,671 | 6/1971 | Deboo | 307/261 |
| 3,493,784 | 2/1970 | Brolin | 307/260 |
| 3,531,656 | 9/1970 | Ammann | 307/229 |

*Primary Examiner*—Stanley D. Miller, Jr.
*Assistant Examiner*—B. P. Davies
*Attorney, Agent, or Firm*—Schiller & Pandiscio

[57] ABSTRACT

A current mode operational rectifier has an output terminal connectable as a DC current source of a predetermined polarity, and comprises a high gain amplifier having an inverting input terminal for receiving an input signal current from an AC current source and two alternative transmission paths for providing full wave rectification. The first transmission path includes a first transistor having its base connected to the output terminal of the amplifier and its emitter and collector connected between the output terminal of the rectifier and the input terminal of the amplifier. The first transmission path conducts DC current to the output from the input terminal of the amplifier at an instantaneous level substantially equal to the instantaneous level of the input signal when the input signal is of a first polarity. The second transmission path includes matched second and third transistors. The second transistor has its emitter and collector connected between the input and output terminals of the amplifier while the emitter and collector of the third transistor are connected between the output terminal of the amplifier and the output terminal of the rectifier. The second transistor conducts the input signal from the input terminal of the amplifer to the output terminal of the amplifer and the third transistor simultaneously conducts current to the output from the output of the amplifier at an instantaneous level substantially equal to the instantaneous level of the input signal when the input signal is of a polarity opposite that of the first polarity.

13 Claims, 2 Drawing Figures

OPERATIONAL RECTIFIER

This invention relates to rectification circuits and more particularly to a current mode operational rectification circuit.

Operational rectification circuits (rectifying circuits containing at least one operational amplifier stage) are well known, particularly in the field of information transmission where rectifying bridges, otherwise suitable for power transmission, tend to distort a signal containing information. A variety of operational rectification circuits are known for providing full wave rectification of an AC input signal. One such circuit includes an operational amplifier stage having a feedback resistor connected between the output of the stage and its inverting input terminal. The direct input terminal of the stage is connected directly to ground through a switch, the opening and closing of the latter being controlled by the output of a commutation gate, e.g. a threshold amplifier. The input signal is applied through load resistors to each of the input terminals of the amplifier stage and to the input of the threshold amplifier. The threshold amplifier is set so that when the input signal is of a positive polarity, the switch is open and a greater voltage level is applied through the load resistors to the direct input terminal of the stage than the voltage level applied to the inverting input terminal of the stage. The gain setting of the stage is such that when the input signal is of a positive polarity, the instantaneous level of the output current is equal in magnitude and polarity to the instantaneous level of the input current.

When the input signal is of a negative polarity, the output of the threshold amplifier is such that the switch closes and shorts the direct input of the amplifier stage to ground. This provides a greater voltage level at the inverting input terminal of the stage so that the latter becomes an inverting amplifier. In this situation, the instantaneous level of the output current is equal in magnitude to the instantaneous level of the input current except that it is of opposite polarity so that full wave rectification of the input signal current is provided.

A second type of known circuit useful for information transmission and providing full wave rectification of an AC input signal includes two operational amplifier stages. A first one of the amplifier stages has its direct input connected to ground and its inverting input connected through a load resistor to the input terminal of the circuit. The output of the first stage is connected through a first feedback circuit to the cathode of a first diode, the latter having its anode connected to the inverting input of the stage. The output of the first amplifier stage is also connected to the anode of a second diode, the latter having its cathode connected through a first feedback resistor to the inverting input of the first amplifier to form a second feedback loop. As is well known in the art, where the load resistor and first feedback resistor are matched, the signal appearing at the output junction (between the cathode of the second diode and the first feedback resistor) will be the half wave rectification of the input signal. This output junction is connected through an intermediate resistor, matched to the load and first feedback resistors to the inverting input of the second amplifier stage. The inverting input of the second amplifier is also connected through a second load resistor (twice the value of the previously mentioned load and feedback resistors) to the input terminal of the circuit. Finally, the output of the second amplifier stage is connected through a second feedback resistor (matched to the second load resistor) to its inverting input, while the direct input terminal of the second stage is connected to ground.

During operation when the input signal is of a positive polarity, the output of the first amplifier stage is negative so that the first diode will conduct while the second diode is nonconducting. Thus, no current output appears at the output junction of the half-wave rectifier. Simultaneously, however, the input signal is applied through the second load resistor to the inverting input of the second amplifier stage so that the instantaneous level of current provided at the output of the second stage is substantially equal to the instantaneous level of the current input but opposite in polarity.

When however, the input of the circuit is of a negative polarity, the output of the first amplifier is positive so that the first diode is nonconductive and the second diode is conductive. The second diode thus conducts current to the output junction of the half-wave rectifier. The current is then split evenly between the first feedback resistor and the intermediate resistor (since the latter two resistors are matched). Current transmitted through the intermediate resistor is applied to the inverting input terminal of the second amplifier stage, while an opposite current is simultaneously transmitted through the second load resistor to the inverting input terminal so that the instantaneous level of the current output of the stage is substantially of the same magnitude and polarity as the instantaneous level of the input signal current.

These circuits as described, however, are unsatisfactory, particularly for low level, high frequency input signals. Both circuits are dependent upon matched resistors or accurate resistance ratios which are difficult to achieve using current integrated circuit techniques. Another problem arises from the fact that each operational amplifier inherently has an offset voltage between its two input terminals. The offset voltage provides an offset current in the output signal of each circuit described. Where the input signals are at relatively low levels this offset current can introduce a significant difference error between (1) the output when the input is of one polarity and (2) the output when the input is of the opposite polarity.

Various ways of reducing the errors caused by the offset voltage are known. For example, in the second circuit described, the offset current could be substantially eliminated by matching the two operational amplifiers in accordance with a technique known as "trimming". This technique however is rather elaborate and can contribute considerably to the cost of the circuit also, the slew rate requirement of at least the first amplifier stage of the circuit is rather stringent if the circuit is to operate as a class A device, i.e. a device in which the output current flows throughout 360° of the cycle of the input signal. For example, as the input signal changes from a positive polarity to a negative polarity at the zero axis crossing, the first diode stops conducting while the second diode begins conducting. However, the latter diode requires a slight bias voltage before it conducts. If the output of the first amplifier stage is to provide this biasing voltage quickly so that the interval between the time at which the first diode stops conducting to the time at which the second diode begins conducting is minimized, the slew rate of the stage must be quite large. This requirement is of even greater significance if the input is at a relatively low amplitude and high frequency, since the portion of the input signal near each zero axis crossing will be lost at the output of the circuit when neither diode is conducting.

Accordingly, it is an object of the present invention to provide an improved operational rectifier which overcomes the above-mentioned disadvantages of the prior art.

More specifically it is an object of the present invention to provide an improved operational rectifier which may be easily manufactured in accordance with integrated circuit techniques, does not require matched resistances or accurate resistance ratios, employs only one operational amplifier and therefore no matching of amplifiers or trimming is required, is not affected by any offset voltages which may exist between the input terminals of the operational amplifier, provides in its preferred form broad band rectification in a nanoampere to milliampere range, and can easily be modified so as to insure that the circuit will operate as a class A device, particularly for low voltage, high frequency inputs, with relatively relaxed slew rate requirements of the operational amplifier.

These and other objects are achieved by a device having an output terminal connectable as a DC current source of a predetermined polarity, the device comprising a high gain amplifier having an inverting input terminal for receiving an input signal current from an AC current source applied at the input terminal of the device and two alternative transmission paths around the amplifier. The first transmission path includes first controllable current conveying means coupled between the input and output terminals of the device and connected to be controlled by the output signal from the amplifier so that current flows between the input and output terminals of the device along the first transmission path only when the input signal is of a first polarity. The second transmission path includes second controllable current conveying means coupled between the input and output terminals of the device and connected to be controlled by the output signal from the amplifier so that current flows between the input and output terminals of the amplifier stage along the second transmission path and simultaneously a mirror current equal in magnitude flows between the output of the amplifier stage and the output of the device only when the input signal is of a polarity opposite to the first polarity.

Other objects of the invention will in part be obvious and will in part appear hereinafter. The invention accordingly comprises the product possessing the features, properties and relation of components which are exemplified in the following detailed disclosure and the scope of the application of which will be indicated in the claims.

For a fuller understanding of the nature and objects of the present invention, reference should be had to the following detailed description taken in connection with the accompanying drawing wherein.

Like numerals are used to indicate like parts in the figures.

Figure 1:
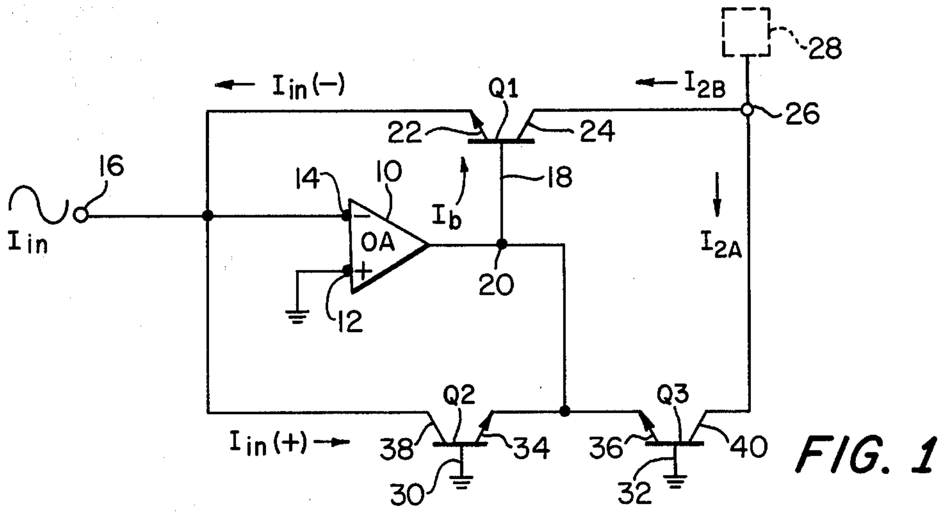
FIG. 1 shows a circuit schematic of an embodiment of the present invention.

The preferred device which can easily be manufactured in accordance with present IC techniques is shown in FIG. 1 as including a high gain inverting amplifier stage 10. Amplifier 10 has its direct input terminal 12 connected to system ground and its inverting input terminal 14 connected to input terminal 16 of the device for receiving AC current input signal $I_{in}$. Amplifier 10 is used as the amplifier stage in an operational amplifier configuration.

A first transmission path is provided by transistor $Q_1$ which in the illustrated embodiment is a npn type transistor having its base 18 connected directly to output terminal 20 of amplifier 10, its emitter 22 directly to input terminal 16 of the device and its collector 24 connected to output terminal 26 of the device. Means are provided for coupling output terminal 26 to source a current $I_2$ provided by a secondary current source such as an operational amplifier virtual ground shown schematically at 28 set at a predetermined DC voltage with respect to system ground. Preferably, the DC voltage level is a positive value near ground. For example, one value of voltage level for secondary current source 28, found to be satisfactory, is +0.5 DC volts. Transistor $Q_1$ is preferably a high gain transistor for reasons which will become more evident hereinafter. For example, a gain of 100 is satisfactory although higher gains of up to 300 can be achieved using current IC techniques.

A second transmission path is provided by the transistors $Q_2$ and $Q_3$, each illustrated as npn transistors having their respective bases 30 and 32 connected to system ground and their emitters 34 and 36 tied together to the output of amplifier 10. Collector 38 of transistor $Q_2$ is connected to inverting input terminal 14 of amplifier 10, collector 40 of transistor of $Q_3$ being connected to the output terminal 26. Preferably, transistors $Q_2$ and $Q_3$ are well matched geometrically for gain, size, etc., so that the two transistors are always maintained at approximately the same base-to-emitter voltage so as to provide equal collector currents.

In operation, when $I_{in}$ is of a positive polarity, the output of amplifier 10 is a negative voltage. The base of transistor $Q_2$ then being positive with respect to its emitter, transistor $Q_2$ conducts current $I_{in}(+)$ from inverting input terminal 14 of amplifier 10 to output terminal 20 of the amplifier. Since the external source providing current $I_2$ is at a positive DC voltage level, and base 32 of transistor $Q_3$ is positive with respect to emitter 36 so that transistor $Q_3$ also conducts a current $I_{2A}$. Since transistors $Q_2$ and $Q_3$ are matched and are always at the same base-to-emitter voltage, the instantaneous level of $I_{in}$ (+) equals the instantaneous level of $I_{2A}$. Thus, $I_{2A}$ is the mirrored current signal of $I_{in}(+)$, i.e., $I_{2A}$ is substantially equal in magnitude to $I_{in}(+)$. Because Kirchhoff's Law provides that currents flowing into a junction are equal to the currents flowing out of the junction, the instantaneous level of the current flowing to the output of amplifier 10 will be equal to the sum of the instantaneous values of $I_{in}(+)$ and $I_{2A}$.

Since the instantaneous level of $I_{in}$ (+) equals the instantaneous level of $I_{2A}$, the output current follows the input current when the latter is of a positive polarity. During this period, since the output signal of amplifier 10 applied to the base of transistor $Q_1$ is negative, transistor $Q_1$ will not conduct.

When the AC input current $I_{in}$ is of a negative polarity, amplifier 10 provides a positive output voltage. Emitter 34 of transistor $Q_2$ is then positive with respect to its base 30 and emitter 36 of transistor $Q_3$ is positive with respect to its base 32 so that neither transistor $Q_2$ nor $Q_3$ will conduct. However, collector 24 of transistor $Q_1$ is positive with respect to its emitter 22 so that a collector-emitter current will flow through transistor $Q_1$. This current flow is such that the emitter current $I_{in}$ (−), flowing from the emitter of $Q_1$ to inverting input terminal 14 will be equal to the base current $I_b$ flowing from output terminal 20 of amplifier 10 to the base of the transistor $Q_1$ plus the collector current $I_{2B}$ flowing from external current source 28. The value of the base current $I_b$ is dependent on the gain of transistor $Q_1$, and by chosing a high gain transistor for transistor $Q_1$, the error introduced by $I_b$ will be negligible. For example, for a gain of 100, $I_b$ will be approximately 1% of $I_{in}$(−), or $I_{2B}$ will be 99% of $I_{in}$ (−). Thus, for the example given, the instantaneous level of the outut current appearing at terminal 26 will be substantially equal to the instantaneous level of the input current $I_{in}$ when the latter is positive, and approximately 99% of the instantaneous level of the input current $I_{in}$ (and of opposite polarity when the input current is negative).

If this small error between the two output currents provided by positive and negative swings of the input current $I_{in}$ is unacceptable, it can be eliminated by modifying the circuit of FIG. 1 so as to apply a bias potential between the bases of transistors $Q_2$ and $Q_3$. More specifically, referring to FIG. 2, base 30 of transistor $Q_2$ remains at system ground but is also connected through resistor 42 to base 32 of transistor $Q_3$. Base 32 of transistor $Q_3$ is also connected through resistor 44 to the tap of potentiometer 46. The potentiometer is connected in the usual manner across a DC voltage source. By properly adjusting the tap of potentiometer 46 a sufficient base voltage is introduced in transistor $Q_3$ (which is added to the base-to-emitter voltage of $Q_3$ to reduce its emitter current with respect to $Q_2$) to reduce the instantaneous level of $I_{24}$. By properly adjusting potentiometer 46, exact symmetry of gain is achieved.

In the circuit of FIG. 1 the slew rate of amplifier 10 is determined by the amount of time between when one transmission path stops conducting and the other transmission path begins to conduct. The slew rate may be of little significance when the input signal $I_{in}$ swings between relatively large positive and negative levels. However, where input signal $I_{in}$ is of a relatively small magnitude and at relatively high frequencies, the amount of time required for the output signal to swing from a sufficient magnitude at one polarity so that one transmission path begins to conduct to a sufficient magnitude at the other polarity so that the other transmission path begins to conduct, can become significant since any information contained in the input signal during this time will be lost.

Figure 2:
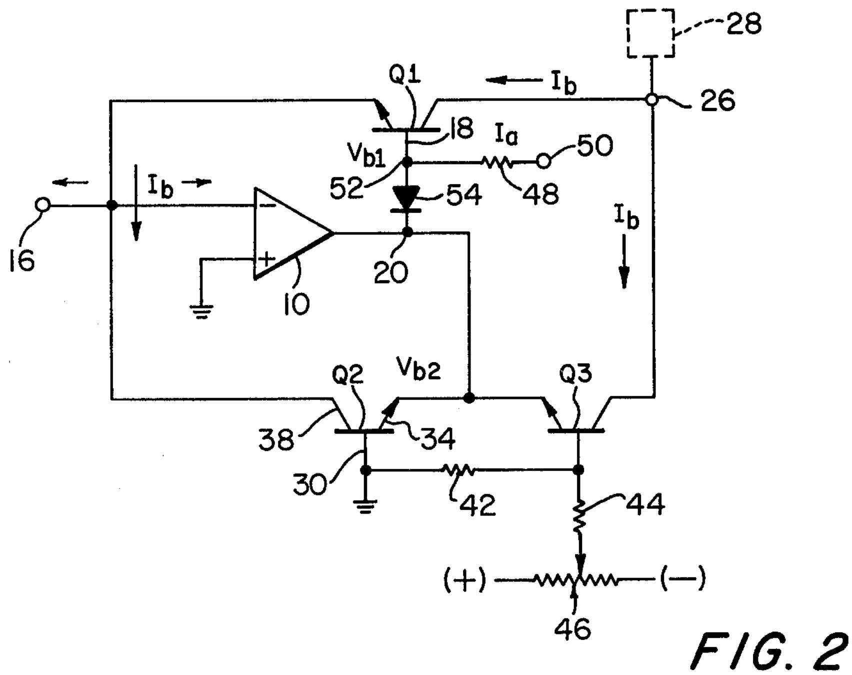
FIG. 2 shows a further modification of the embodiment of FIG. 1.

Accordingly, the circuit of FIG. 1 can be also modified as shown in FIG. 2 in order to provide less stringent slew rate requirements. More particularly a DC voltage source is provided between base 18 of transistor $Q_1$ and output terminal 20 of amplifier 10. The source may simply be a DC battery, or preferably a small current flow $I_g$ is provided from a fixed resistance 48 coupled between terminal 50 (at which a suitable voltage can be applied) and junction 52 between the base of transistor $Q_1$ and the anode of diode 54. The cathode of diode 54 is connected to the output terminal 20 of amplifier 10. This voltage source provides in effect a positive biasing voltage $V_{b1}$ on the base of transistor $Q_1$ and a negative biasing voltage $V_{b2}$ on the emitters of transistors $Q_2$ and $Q_3$. The biasing voltage tends to produce a slight current $I_b$ through the collector-emitter junction of transistor $Q_1$ which will be transmitted through the collector-emitter junction of transistor $Q_2$ and emitter-collector junction of transistor $Q_3$. This results in a circulating current which has no effect on the value of the signal applied to the input of the device at terminal 16, but appears at twice the magnitude at the output of the device at terminal 26. However, by providing a cross-over bias, the device will operate more closely as a class A device when the input signal crosses from one polarity to another, permitting better high frequency operation, since initial conduction through either transistor $Q_1$ or transistor $Q_2$, $Q_3$ is not as dependent upon the voltage level of the output of amplifier 10.

Although the invention has been described in its preferred embodiment it will be obvious that various modifications can be made without departing from the scope of the inventon. For example, transistors $Q_1$, $Q_2$ and $Q_3$ are shown as npn transistors. Alternatively, all of these transistors can be pnp type transistors so long as transistors $Q_2$ and $Q_3$ are matched. In such a case the output terminal 26 would be biased to a slightly negative DC voltage, e.g. −0.5 volts, and the polarity of the current delivered to terminal 26 would be opposite in polarity to the current delivered in the npn embodiment previously described.

The above-described operational rectifying circuit has several advantages. The circuit is easily manufactured in accordance with integrated circuit techniques. Accuracy in operation is not dependent on matched resistance or accurate resistance ratios. Since only one operational amplifier is employed in the circuit, matching and trimming amplifiers are not required. Any offset voltage which may exist between the inputs of amplifier 10 will not result in an output error current even through it will produce an input error current if the input is fed from a DC voltage source (not shown) through an input resistor (not shown). By eliminating error due to offset voltage, the circuit of the present invention provides broad band recitifaction over a large amplitude range of input signals. Additionally, the circuit can operate substantially as a class A device, particularly for low voltage, high frequency inputs, with relatively relaxed slew rate requirements by employing the biasing voltage at junction 52.

Since certain obvious changes may be made in the illustrated embodiment of the device without departing from the scope of the invention, it is intended that all matter contained herein be interpeted as illustrative and not in a limiting sense.

What is claimed is:

1. A device for rectifying an AC current input signal applied at its input terminal and adapted to have its output terminal connected as a DC current source, said device comprising in combination:

an amplifier stage having an inverting input terminal connected to the input terminal of said device, and an output terminal;

a first transmission path including first controllable current conveying means coupled between the input and output terminals of said device and connected to be controlled by the output signal from said amplifier stage so that current flows between the input and output terminals of the device along said first transmission path only when said input signal is of a first polarity; and a second transmission path including second controllable current conveying means coupled between the input and output terminals of said device and connected to be controlled by the output signal from said amplifier stage so that a second current flows between said input and output terminals of said amplifier stage along said second transmission path and an inverted current substantially equal in magnitude but opposite in polarity to said second current simultaneously flows between the output terminal of said amplifier stage and the output terminal of said device along said second transmission path only when said input signal is of a polarity opposite said first polarity.

2. A device for rectifying an AC current input signal applied at its input terminal, and adapted to have its output terminal connected as a DC current source, said device comprising, in combination:

an amplifier stage having an inverting input terminal connected to the input terminal of said device, and an output terminal;

a first transmission path including a first transistor having its base connected to the output terminal of said stage and its emitter and collector between the input and output terminals of said device for conducting current from said DC current source to said input terminal of said stage at an instantaneous level proportional to the instantaneous level of said AC input signal when the latter is of a first polarity; and a second transmission path including a second and third transistor, said second transistor having its emitter and collector connected between the inverting input terminal and the output terminal of said stage, and said third transistor having its emitter and collector connected between the output terminal of said stage and the output terminal of said device so that said second transistor can conduct said AC input signal and said third transistor can conduct current from said DC current source to said output terminal of said stage at an instantaneous level proportional to the instantaneous level of said AC input signal when the latter is of a second polarity opposite to said first polarity.

3. A device in accordance with claim 2, wherein said second and third transistors are matched to have substantially the same base-to-emitter voltage with equal collector currents.

4. A device in accordance with claim 3, wherein the bases of said second and third transistors are both connected to system ground.

5. A device in accordance with claim 3, wherein the bases of said second and third transistors are both connectd to a constant reference potential.

6. A device in accordance with claim 2, wherein said amplifier stage has a direct input terminal, said direct input terminal being connected to system ground.

7. A device in accordance with claim 2, further including means for providing symmetry of gain between the output provided by said first transmission path and said second transmission path.

8. A device in accordance with claim 7 wherein said means for providing symmetry of gain includes means for varying the base voltages of said second and third transistors relative to one another.

9. A device in accordance with claim 8 wherein said second and third transistors are substantially matched and said means for varying the base voltages includes a first resistance connected between the bases of said second and third transistors and the base of said third transistor is connected to a variable voltage source.

10. A device in accordance with claim 2, including means for providing a cross-over bias between the base of said first transistor and the output of said stage.

11. A device in accordance with claim 2, further including means for reducing the cross-over output voltage of said amplifier required for one of said transmission paths to begin conducting after the other of said transmission paths has stopped conducting.

12. A device in accordance with claim 11, wherein said means for reducing the cross-over output voltage includes a voltage source between the base of said first transistor and the second and third transistors.

13. A device in accordance with claim 11, wherein said voltage source includes a diode having an anode and a cathode, and a current source, said anode being connected to the baseof said first transistor, said cathode being connected to the output of said stage and said current source providing a current to the base of said first transistor and said anode of said diode.

* * * * *